United States Patent
Lin et al.

(10) Patent No.: US 8,054,444 B2
(45) Date of Patent: Nov. 8, 2011

(54) LENS CLEANING MODULE FOR IMMERSION LITHOGRAPHY APPARATUS

(75) Inventors: Burn-Jeng Lin, Hsin-Chu (TW); David Lu, Hsin-Chu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 778 days.

(21) Appl. No.: 11/222,319

(22) Filed: Sep. 7, 2005

(65) Prior Publication Data

US 2006/0028628 A1 Feb. 9, 2006

Related U.S. Application Data (63) Continuation-in-part of application No. 10/910,480, filed on Aug. 3, 2004, now Pat. No. 7,224,427.

(51) Int. Cl.
 *G03B 27/52* (2006.01)
(52) U.S. Cl. ............................................. 355/30
(58) Field of Classification Search ............ 355/30, 355/67, 53
 See application file for complete search history.

(56) References Cited

U.S. PATENT DOCUMENTS

| | | | | |
|---|---|---|---|---|
| 5,610,683 A | * | 3/1997 | Takahashi | 355/53 |
| 6,496,257 B1 | * | 12/2002 | Taniguchi et al. | 356/239.2 |
| 6,952,253 B2 | * | 10/2005 | Lof et al. | 355/30 |
| 6,992,750 B2 | * | 1/2006 | Kawashima et al. | 355/30 |
| 7,388,649 B2 | * | 6/2008 | Kobayashi et al. | 355/53 |
| 2004/0134514 A1 | | 7/2004 | Wu et al. | |
| 2004/0247790 A1 | | 12/2004 | Moriyama | |
| 2005/0048223 A1 | | 3/2005 | Pawloski et al. | |
| 2005/0110985 A1 | * | 5/2005 | Yogev | 356/237.1 |
| 2005/0134817 A1 | | 6/2005 | Nakamura | |
| 2005/0161644 A1 | * | 7/2005 | Zhang et al. | 252/582 |
| 2005/0225734 A1 | | 10/2005 | De Smit et al. | |
| 2006/0023185 A1 | * | 2/2006 | Hazelton et al. | 355/53 |
| 2006/0023187 A1 | * | 2/2006 | Eaton | 355/53 |
| 2006/0132731 A1 | * | 6/2006 | Jansen et al. | 355/30 |
| 2007/0039637 A1 | * | 2/2007 | Higashiki et al. | 134/115 R |
| 2007/0171390 A1 | * | 7/2007 | Hazelton et al. | 355/30 |

FOREIGN PATENT DOCUMENTS

| | | |
|---|---|---|
| CN | 1637608 A | 7/2005 |
| EP | 1486827 A2 | 12/2004 |
| EP | 1486827 A3 | 3/2005 |
| JP | 10-303114 | * 11/1998 |
| JP | 10-340846 | * 12/1998 |

(Continued)

OTHER PUBLICATIONS

Chinese Patent Office, Office Action, Apr. 4, 2008, Chinese Patent Application No. 2005101152089, 6 pages.
Taiwan Patent Office, Taiwan Patent Office mailed Oct. 14, 2008, 16 pages, Application No. 094122463.
Japanese Patent Office, Office Action Aug. 10, 2009, Application No. 2005-334838, 4 pages.

*Primary Examiner* — Peter B Kim
*Assistant Examiner* — Chia-how Michael Liu
(74) *Attorney, Agent, or Firm* — Haynes and Boone, LLP (57) ABSTRACT

A lens cleaning module for a lithography system having an exposure apparatus including an objective lens is provided. The lens cleaning module includes a scanning stage for supporting a wafer beneath the objective lens. A cleaning module is provided adjacent to the scanning stage for cleaning the objective lens in a non-manual cleaning process.

21 Claims, 5 Drawing Sheets

FOREIGN PATENT DOCUMENTS

| | | |
|---|---|---|
| JP | 2005-5713 A | 1/2005 |
| JP | 2005005713 A | 1/2005 |
| TW | 200510957 | 3/2005 |
| TW | 253546 B | 4/2006 |
| WO | 2004093130 A2 | 10/2004 |
| WO | 2004093130 A3 | 10/2004 |
| WO | WO 2004/105107 * | 12/2004 |
| WO | 2005022266 A2 | 3/2005 |

* cited by examiner

LENS CLEANING MODULE FOR IMMERSION LITHOGRAPHY APPARATUS

CROSS-REFERENCE TO RELATED APPLICATIONS

This is a continuation-in-part of application Ser. No. 10/910,480, filed Aug. 3, 2004 now U.S. Pat. No. 7,224,427.

FIELD OF THE INVENTION

The present invention relates to photolithography processes used in the formation of integrated circuit (IC) patterns on photoresist in the fabrication of semiconductor integrated circuits. More particularly, the present invention relates to a lens cleaning module which cleans an objective lens of a lithography system exposure apparatus to enhance the integrity of circuit pattern images transferred from a mask to a wafer.

BACKGROUND OF THE INVENTION

Various processing steps are used to fabricate integrated circuits on a semiconductor wafer. These steps include deposition of a conducting layer on the silicon wafer substrate; formation of a photoresist or other mask such as titanium oxide or silicon oxide, in the form of the desired metal interconnection pattern, using standard lithographic or photolithographic techniques; subjecting the wafer substrate to a dry etching process to remove the conducting layer from the areas not covered by the mask, thereby etching the conducting layer in the form of the masked pattern on the substrate; removing or stripping the mask layer from the substrate typically using reactive plasma and chlorine gas, thereby exposing the top surface of the conductive interconnect layer; and cooling and drying the wafer substrate by applying water and nitrogen gas to the wafer substrate.

In a common IC fabrication technique known as a dual damascene technique, lower and upper dielectric layers are sequentially deposited on a substrate. A via opening is patterned and etched in the lower dielectric layer, and a trench opening is patterned and etched in the upper dielectric layer. At each step, a patterned photoresist layer is used to etch the trench and via openings in the corresponding dielectric layer. A conductive copper line is then formed in the trench and via openings, typically using electrochemical plating (ECP) techniques, to form the horizontal and vertical IC circuit interconnects on the substrate.

Photoresist materials are coated onto the surface of a wafer, or onto a dielectric or conductive layer on a wafer, by dispensing a photoresist fluid typically on the center of the wafer as the wafer rotates at high speeds within a stationary bowl or coater cup. The coater cup catches excess fluids and particles ejected from the rotating wafer during application of the photoresist. The photoresist fluid dispensed onto the center of the wafer is spread outwardly toward the edges of the wafer by surface tension generated by the centrifugal force of the rotating wafer. This facilitates uniform application of the liquid photoresist on the entire surface of the wafer.

During the photolithography step of semiconductor production, light energy is applied through a reticle or mask onto the photoresist material previously deposited on the wafer to define circuit patterns which will be etched in a subsequent processing step to define the circuits on the wafer. A reticle is a transparent plate patterned with a circuit image to be formed in the photoresist coating on the wafer. A reticle contains the circuit pattern image for only a few of the die on a wafer, such as four die, for example, and thus, must be stepped and repeated across the entire surface of the wafer. In contrast, a photomask, or mask, includes the circuit pattern image for all of the die on a wafer and requires only one exposure to transfer the circuit pattern image for all of the dies to the wafer.

Spin coating of photoresist on wafers, as well as the other steps in the photolithography process, is carried out in an automated coater/developer track system using wafer handling equipment which transport the wafers between the various photolithography operation stations, such as vapor prime resist spin coat, develop, baking and chilling stations. Robotic handling of the wafers minimizes particle generation and wafer damage. Automated wafer tracks enable various processing operations to be carried out simultaneously. Two types of automated track systems widely used in the industry are the TEL (Tokyo Electron Limited) track and the SVG (Silicon Valley Group) track.

A typical method of forming a circuit pattern on a wafer includes introducing the wafer into the automated track system and then spin-coating a photoresist layer onto the wafer. The photoresist is next cured by conducting a soft bake process. After it is cooled, the wafer is placed in an exposure apparatus, such as a stepper, which aligns the wafer with an array of die patterns etched on the typically chrome-coated quartz reticle. When properly aligned and focused, the stepper exposes a small area of the wafer, then shifts or "steps" to the next field and repeats the process until the entire wafer surface has been exposed to the die patterns on the reticle. The photoresist is exposed to light through the reticle in the circuit image pattern. Exposure of the photoresist to this image pattern cross-links and hardens the resist in the circuit pattern. After the aligning and exposing step, the wafer is exposed to post-exposure baking and then is developed and hard-baked to develop the photoresist pattern.

The circuit pattern defined by the developed and hardened photoresist is next transferred to an underlying metal layer using an etching process, in which metal in the metal layer not covered by the cross-linked photoresist is etched away from the wafer with the metal under the cross-linked photoresist that defines the device feature protected from the etchant. Alternatively, the etched material may be a dielectric layer in which via openings and trench openings are etched according to the circuit pattern, such as in a dual damascene technique. The via and trench openings are then filled with a conductive metal such as copper to define the metal circuit lines. As a result, a well-defined pattern of metallic microelectronic circuits, which closely approximates the cross-linked photoresist circuit pattern, is formed on the wafer.

One type of lithography which is used in the semiconductor fabrication industry is immersion lithography, in which an exposure apparatus includes a mask and lens which are provided over an optical transfer chamber. A water-containing exposure liquid is distributed through the optical transfer chamber. In operation, the optical transfer chamber is placed over an exposure field on a photoresist-coated wafer. As the exposure liquid is distributed through the optical transfer chamber, light is transmitted through the mask, lens and exposure liquid in the optical transfer chamber, respectively, and onto the photoresist of the exposure field. The circuit pattern image in the mask is therefore transferred by the light transmitted through the exposure liquid to the photoresist. The exposure liquid in the optical transfer chamber enhances the resolution of the transmitted circuit pattern image on the photoresist.

Prior to distribution of the exposure liquid through the optical transfer chamber, the aqueous liquid is typically degassed to remove most of the microbubbles from the liquid. However, some of the microbubbles remain in the liquid during its distribution through the optical transfer chamber. These remaining microbubbles have a tendency to adhere to the typically hydrophobic surface of the photoresist, thereby distorting the circuit pattern image projected onto the photoresist. Accordingly, an apparatus and method is needed to substantially obliterate microbubbles in an exposure liquid during immersion lithography in order to prevent distortion of the circuit pattern image projected onto the photoresist in an exposure field.

An object of the present invention is to provide a novel apparatus for substantially eliminating microbubbles in an exposure liquid before or during immersion lithography.

Another object of the present invention is to provide a novel megasonic exposure apparatus which is capable of substantially eliminating microbubbles in an exposure liquid before or during immersion lithography.

Still another object of the present invention is to provide a novel megasonic exposure apparatus which enhances the quality of a circuit pattern image projected onto a photoresist during immersion lithography.

Yet another object of the present invention is to provide a novel megasonic exposure apparatus in which sonic waves are used to substantially obliterate microbubbles in an exposure liquid before or during immersion lithography.

A still further object of the present invention is to provide a novel megasonic immersion lithography exposure method in which sonic waves are used to substantially obliterate microbubbles in an exposure liquid before or during immersion lithography.

A still further object of the present invention is to provide a novel megasonic immersion lithography exposure method in which sonic waves are used to substantially obliterate microbubbles and particles on exposure lens before or during immersion lithography.

SUMMARY OF THE INVENTION

In accordance with these and other objects and advantages, the present invention is generally directed to a novel megasonic immersion lithography exposure apparatus for substantially eliminating microbubbles from an exposure liquid before, during or both before and during immersion lithography. In one embodiment, the apparatus includes an optical transfer chamber which is positioned over a resist-covered wafer, an optical housing which is fitted with a photomask and lens provided over the optical transfer chamber, and an inlet conduit for distributing an immersion liquid into the optical transfer chamber. At least one megasonic plate operably engages the inlet conduit to perpetuate sonic waves through the immersion liquid as the liquid is distributed through the inlet conduit and into the optical transfer chamber. The sonic waves substantially obliterate microbubbles in the exposure liquid such that the liquid enters the optical transfer chamber in a substantially bubble-free state for the exposure step. In another embodiment, the apparatus includes an annular megasonic plate, which encircles the optical transfer chamber.

The present invention is further directed to a method for substantially eliminating microbubbles in an exposure liquid used in an immersion lithography process for transferring a circuit pattern image from a mask or reticle to a resist-covered wafer. The method includes propagating sound waves through an exposure liquid before, during or both before and during distribution of the exposure liquid through an optical transfer chamber of an immersion lithography exposure apparatus. The sound waves substantially obliterate microbubbles in the exposure liquid and remove microbubbles from the resist surface, thereby preventing microbubbles from adhering to the resist on the surface of a wafer and distorting the circuit pattern image transferred from the apparatus, through the exposure liquid and onto the resist.

The present invention is further directed to a method for substantially eliminating microbubbles and particle from exposure lens used in an immersion lithography process for transferring a circuit pattern image from a mask or reticle to a resist-covered wafer. The method includes propagating sound waves through an exposure liquid before, during or both before and during distribution of the exposure liquid through an optical transfer chamber of an immersion lithography exposure apparatus. The method also includes changing the exposure liquid before, during or both before and during exposure process. The sound waves substantially obliterate microbubbles and particles on the lens surface, thereby preventing microbubbles and particle from adhering to the surface of a emersion lens and distorting the circuit pattern image transferred from the apparatus, through the exposure liquid and onto the resist.

BRIEF DESCRIPTION OF THE DRAWINGS

The invention will now be described, by way of example, with reference to the accompanying drawings, in which.

DETAILED DESCRIPTION OF THE INVENTION

The present invention contemplates a novel megasonic immersion lithography exposure apparatus for substantially eliminating microbubbles from an exposure liquid before, during, or both before and during immersion lithography. In one embodiment, the apparatus includes an optical housing which is fitted with a photomask and a lens. An optical transfer chamber is provided beneath the lens of the optical housing. An inlet conduit is provided in fluid communication with the optical transfer chamber to distribute an immersion liquid into the chamber. At least one megasonic plate operably engages the inlet conduit to perpetuate sonic waves through the immersion liquid as the liquid is distributed through the inlet conduit and into the optical transfer chamber. In another embodiment, an annular megasonic plate encircles the optical transfer chamber of the apparatus.

In operation of the apparatus, the optical transfer chamber is positioned over an exposure field on a photoresist-coated wafer. The sonic waves generated by the megasonic plate or plates substantially obliterate microbubbles in the exposure liquid, such that the liquid enters the optical transfer chamber in a substantially bubble-free state. During the exposure step, light is transmitted through the photomask and lens, respectively, of the optical housing; through the exposure liquid in the optical transfer chamber; and onto the photoresist coated onto the wafer. The exposure liquid, substantially devoid of microbubbles, transmits the substantially distortion-free circuit pattern image onto the photoresist with high resolution.

The present invention is further directed to a method for substantially eliminating microbubbles in an exposure liquid used in an immersion lithography process exposure step to transfer a circuit pattern image from a mask or reticle to an exposure field on a resist-covered wafer. In a first embodiment, the method includes propagating sound waves through an exposure liquid to obliterate microbubbles in the liquid before the exposure step. In a second embodiment, the method includes propagating sound waves through the exposure liquid both before and during the exposure step. In a third embodiment, the method includes intermittently propagating sound waves through the exposure liquid during the exposure step. The megasonic power applied by the megasonic plate or plates to the exposure liquid is preferably about 10~1,000 kHz.

Any of a variety of exposure liquids are suitable for the megasonic immersion lithography method of the present invention. In one embodiment, the exposure liquid includes $NH_4$, $H_2O_2$ and $H_2O$ in a concentration by volume ratio of typically about 1:1:10~1:1:1000. In another embodiment, the exposure liquid includes $NH_4$ and $H_2O$ in a concentration by volume ratio of typically about 1:10~1:1000. In still another embodiment, the exposure liquid is deionized (DI) water. In yet another embodiment, the exposure liquid is ozonated ($O_3$) water, having an ozone concentration of typically about 1~1000 ppm. The exposure liquid may include a non-ionic surfactant, an anionic surfactant or a cationic surfactant having a concentration in the range of typically about 1~0000 ppm.

Figure 1:
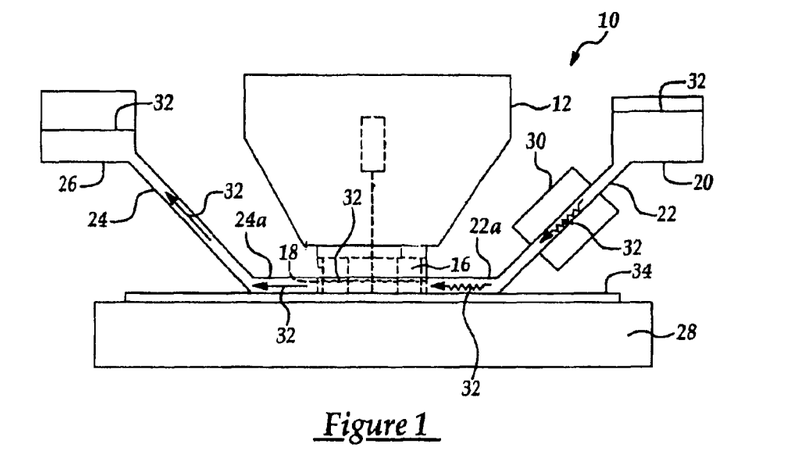
FIG. 1 is a schematic view of a megasonic immersion lithography apparatus according to a first embodiment of the present invention.

Referring initially to FIG. 1, a megasonic immersion lithography exposure apparatus, hereinafter exposure apparatus, of the present invention is generally indicated by reference numeral 10. The exposure apparatus 10 includes a wafer stage 28 for supporting a wafer 34 having a photoresist layer (not shown) deposited thereon. An optical housing 12 contains an optical system having a laser (not shown) and the last objective lens 16 which is positioned above the wafer stage 28. A mask or reticle (not shown) is removably inserted in the optical housing 12, above the lens 16. The mask or reticle includes a circuit pattern (not shown) which is to be transmitted onto the photoresist layer on the wafer 34 during a lithography process, which will be hereinafter described. An optical transfer water immersion chamber 18 is provided beneath the last objective lens 16 and is disposed above the wafer stage 28. During lithography, the laser beam through the mask or reticle, which produces a circuit pattern image that is transmitted through the last objective lens 16 and the optical transfer water immersion chamber 18, respectively, and onto the wafer 34.

An inlet liquid reservoir 20, from which extends an inlet conduit 22, contains a supply of exposure liquid 32. A discharge conduit 22a extends from the inlet conduit 22 and is provided in fluid communication with the optical transfer chamber 18. An outlet liquid reservoir 26 is provided in fluid communication with the optical transfer chamber 18 through a collecting conduit 24a and an outlet conduit 24, respectively. According to the present invention, a megasonic plate 30 is provided on the inlet conduit 22, according to the knowledge of those skilled in the art, to generate sonic waves (not shown) in the exposure liquid 32 as the liquid 32 is distributed through the inlet conduit 22.

In operation of the exposure apparatus 10, as hereinafter further described, the exposure liquid 32 is distributed from the inlet liquid reservoir 20, through the inlet conduit 22 and discharge conduit 22a, respectively, and into the optical transfer water immersion chamber 18. The megasonic plate 30 generates sonic waves (not shown) in the exposure liquid 32, obliterating all or most of the microbubbles in the exposure liquid 32. The laser beam from the optical housing 12 which produces a circuit pattern image is transmitted through the lens last objective 16 and exposure liquid 32 contained in the optical transfer water immersion chamber 18, respectively, and is projected onto the photoresist coated on the wafer 34. The exposure liquid 32 is continuous pumped from the optical transfer water immersion chamber 18, through the collecting conduit 24a and outlet conduit 24, respectively, and into the outlet liquid reservoir 26.

Figure 3A:
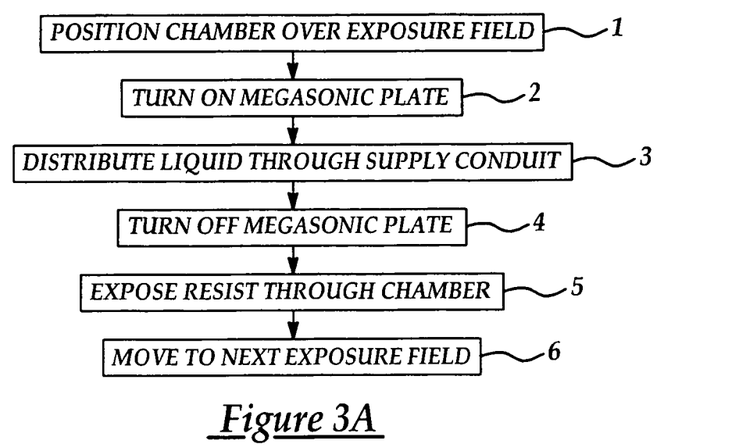
FIG. 3A is a flow diagram which illustrates sequential process steps carried out according to a first embodiment of the method of the present invention.
Figure 3B:
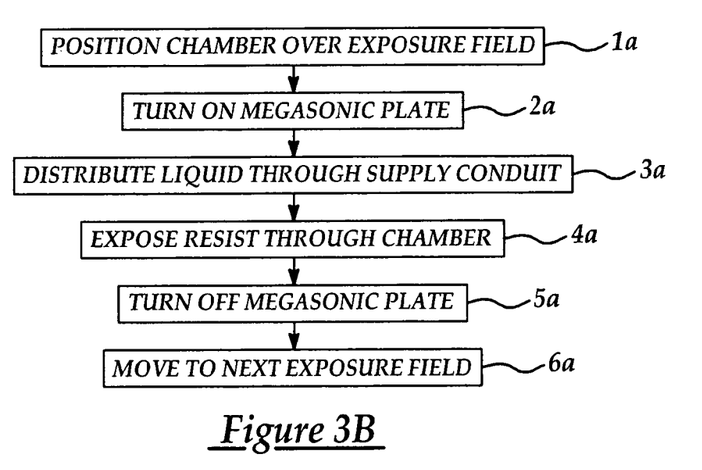
FIG. 3B is a flow diagram which illustrates sequential process steps carried out according to a second embodiment of the method of the present invention.
Figure 3C:
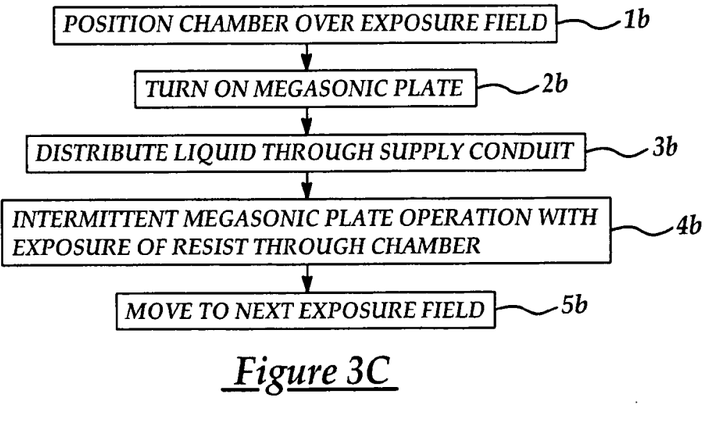
FIG. 3C is a flow diagram which illustrates sequential process step carried out according to a third embodient of the method of the present invention.

Referring next to FIGS. 3A-3C, in conjunction with FIG. 1, the exposure apparatus 10 can be operated according to one of three modes. According to the flow diagram of FIG. 3A, the optical transfer water immersion chamber 18 is initially positioned over an exposure field on the wafer 34, as indicated in step 1. The megasonic plate 30 is then turned on (step 2), followed by distribution of the exposure liquid 32 from the inlet liquid reservoir 20, through the inlet conduit 22 and into the optical transfer water immersion chamber 18, respectively (step 3). As the exposure liquid 32 passes through the inlet conduit 22, the megasonic plate 30 induces the formation of sonic waves in the exposure liquid 32. The sonic waves obliterate microbubbles in the exposure liquid 32, such that the exposure liquid 32 is substantially devoid of microbubbles upon entry into the optical transfer chamber 18. Furthermore, the sonic waves also obliterate the microbubbles on the resist surface through the sonic wave transfer from discharge conduit 22a to optical transfer water immersion chamber 18.

As indicated in step 4, the megasonic plate 30 is turned off prior to exposing the exposure field on the wafer 34 to the circuit pattern image transmitted through the exposure liquid 32 (step 5), the exposure liquid 32 transmits a high-resolution circuit pattern image, which is undistorted by microbubbles onto the surface of the photoresist on the wafer 34. After completion of the exposure step 5, the optical transfer chamber 18 is moved to the next exposure field on the wafer 34 and steps 1-5 are repeated, as indicated in step 6.

According to the flow diagram of FIG. 3B, the optical transfer water immersion chamber 18 is initially positioned over an exposure field on the wafer 34, as indicated in step 1a. The megasonic plate 30 is then turned on (step 2a), followed by distribution of the exposure liquid 32 from the inlet liquid reservoir 20, through the inlet conduit 22 and into the optical transfer water immersion chamber 18, respectively (step 3a). The sonic waves generated by the megasonic plate 30 obliterate microbubbles in the exposure liquid 32 passing through the inlet conduit 22, such that the exposure liquid 32 is substantially devoid of microbubbles upon entry into the optical transfer chamber 18 and the microbubbles adhered on the wafer 34 is therefore obliterate.

As indicated in step 4a, while the megasonic plate 30 remains on, the photoresist on the wafer 34 is exposed. Accordingly, during the exposure step (step 4a), the megasonic plate 20 continues to obliterate microbubbles in the exposure liquid 32 and on the wafer resist surface 34. The circuit pattern image transmitted from the optical housing 12 through the optical transfer chamber 18 is therefore undistorted by microbubbles and is projected onto the surface of the photoresist on the wafer 34 with a high resolution. After completion of the exposure step 4a, the megasonic plate 30 may be turned off (step 5a). The optical transfer chamber 18 is then moved to the next exposure field on the wafer 34 and steps 1-5 are repeated, as indicated in step 6a.

According to the flow diagram of FIG. 3C, the optical transfer chamber 18 is initially positioned over an exposure field on the wafer 34, as indicated in step 1b. The megasonic plate 30 is then turned on (step 2b), and the exposure liquid 32 is distributed from the inlet liquid reservoir 20, through the inlet conduit 22 and into the optical transfer chamber 18, respectively (step 3b). The sonic waves generated by the megasonic plate 30 obliterate microbubbles in the exposure liquid 32 and on the wafer resist surface 34, such that the exposure liquid 32 is substantially devoid of microbubbles upon entry into the optical transfer chamber 18 and adhesion on top of the resist surface 34.

As indicated in step 4b, the exposure step is carried out while the megasonic plate 30 is intermittently turned on and off. Accordingly, during exposure of the wafer 34, the megasonic plate 20 continues to obliterate microbubbles in the exposure liquid 32. After completion of the exposure step 4b, the optical transfer chamber 18 is moved to the next exposure field on the wafer 34 and steps 1-5 are repeated, as indicated in step 5b.

Figure 3D:
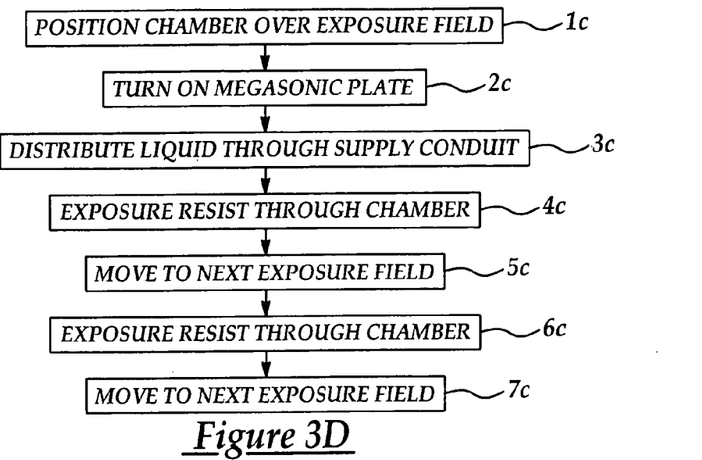
FIG. 3D is a flow diagram which illustrates sequential process step carried out according to a fourth embodient of the method of the present invention.

According to the flow diagram of FIG. 3D, the optical transfer water immersion chamber 18 is initially positioned over an exposure field on the wafer 34, as indicated in step 1c. The megasonic plate 30 is then turned on (step 2c), followed by distribution of the exposure liquid 32 from the inlet liquid reservoir 20, through the inlet conduit 22 and into the optical transfer water immersion chamber 18, respectively (step 3c). The sonic waves generated by the megasonic plate 30 obliterate microbubbles in the exposure liquid 32 passing through the inlet conduit 22, such that the exposure liquid 32 is substantially devoid of microbubbles upon entry into the optical transfer chamber 18 and the microbubbles adhered on the wafer 34 is therefore obliterate.

As indicated in step 4a, while the megasonic plate 30 remains on, the photoresist on the wafer 34 is exposed. Accordingly, during the exposure step (step 4c), the megasonic plate 20 continues to obliterate microbubbles in the exposure liquid 32 and on the wafer resist surface 34. The circuit pattern image transmitted from the optical housing 12 through the optical transfer chamber 18 is therefore undistorted by microbubbles and is projected onto the surface of the photoresist on the wafer 34 with a high resolution. After completion of the exposure step 4a, the megasonic plate 30 may be still turned on. The optical transfer chamber 18 is then moved to the next exposure field on the wafer 34 and steps 4c-5c are repeated, as indicated in step 6c.

Figure 3E:
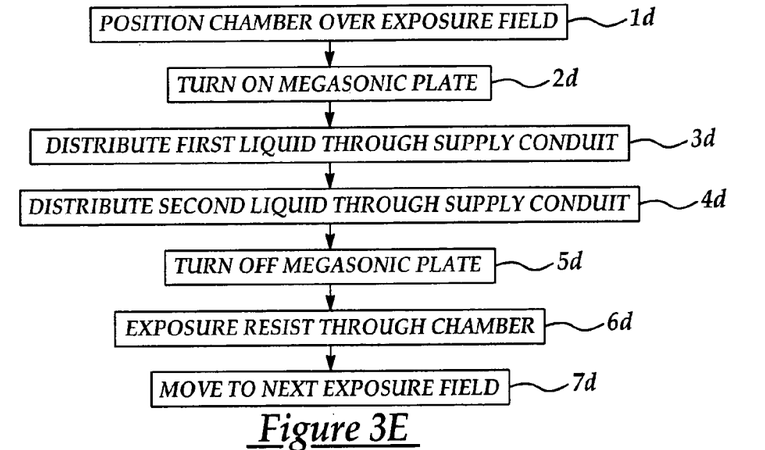
FIG. 3E is a flow diagram which illustrates sequential process step carried out according to a fifth embodient of the method of the present invention.

According to the flow diagram of FIG. 3E, the optical transfer water immersion chamber 18 is initially positioned over an exposure field on the wafer 34, as indicated in step 1d. The megasonic plate 30 is then turned on (step 2d), followed by distribution of the first liquid 32 from the inlet liquid reservoir 20, through the inlet conduit 22 and into the optical transfer water immersion chamber 18, respectively (step 3d). The sonic waves generated by the megasonic plate 30 obliterate microbubbles in the exposure liquid 32 passing through the inlet conduit 22 and removing particle on the low surface of the last objective lens 16, such that the exposure liquid 32 is substantially devoid of microbubbles upon entry into the optical transfer chamber 18 and the particles adhered on the low surface of the last objective lens 16 are therefore obliterated.

As indicated in step 4D, while the megasonic plate 30 remains on, followed by distribution of the second liquid from the inlet liquid reservoir 20, through the inlet conduit 22 and into the optical transfer water immersion chamber 18 to replace the first liquid (step 4d), the photoresist on the wafer 34 is exposed. Accordingly, during the exposure step (step 6d), the megasonic plate does not turn on (step 5d). The circuit pattern image transmitted from the optical housing 12 through the optical transfer water immersion chamber 18 is therefore undistorted by particles and is projected onto the surface of the photoresist on the wafer 34 with a high resolution. After completion of the exposure step 6d, the optical transfer chamber 18 is then moved to the next exposure field on the wafer 34 and steps 6d-7d are repeated, as indicated in step 6d.

Figure 3F:
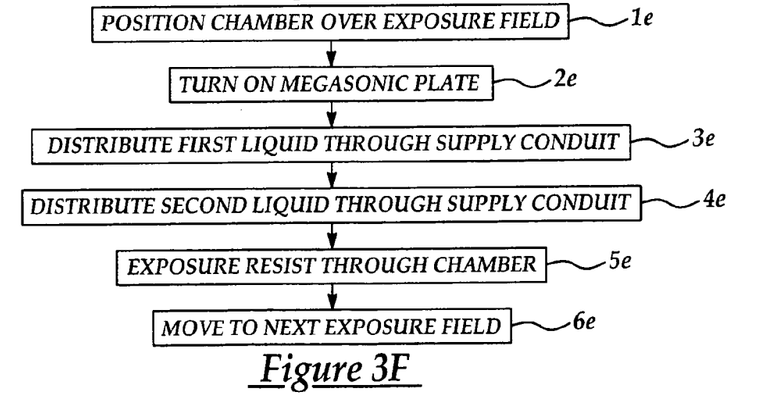

According to the flow diagram of FIG. 3F, the optical transfer water immersion chamber 18 is initially positioned over an exposure field on the wafer 34, as indicated in step 1e. The megasonic plate 30 is then turned on (step 2e), followed by distribution of the first liquid 32 from the inlet liquid reservoir 20, through the inlet conduit 22 and into the optical transfer water immersion chamber 18, respectively (step 3e). The sonic waves generated by the megasonic plate 30 obliterate microbubbles in the exposure liquid 32 passing through the inlet conduit 22 and removing particle on the low surface of the last objective lens 16, such that the exposure liquid 32 is substantially devoid of microbubbles upon entry into the optical transfer chamber 18 and the particles adhered on the low surface of the last objective lens 16 are therefore obliterated.

As indicated in step 4e, while the megasonic plate 30 remains on, followed by distribution of the second liquid from the inlet liquid reservoir 20, through the inlet conduit 22 and into the optical transfer water immersion chamber 18 to replace the first liquid (step 4e), the photoresist on the wafer 34 is exposed. Accordingly, during the exposure step (step 5e), the megasonic plate still turn on (step 2e). The circuit pattern image transmitted from the optical housing 12 through the optical transfer water immersion chamber 18 is therefore undistorted by particles and is projected onto the surface of the photoresist on the wafer 34 with a high resolution. After completion of the exposure step 5e, the optical transfer chamber 18 is then moved to the next exposure field on the wafer 34 and steps 5e-6e are repeated, as indicated in step 5e.

Figure 2:
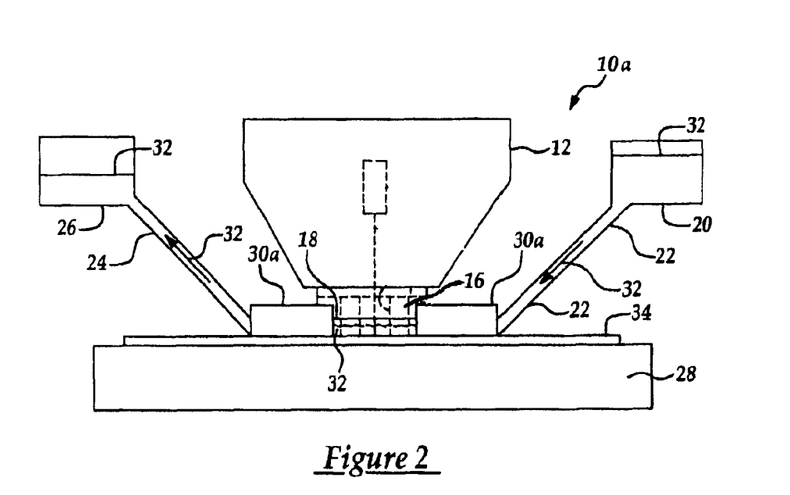
FIG. 2 is a schematic view of a megasonic immersion lithography apparatus according to a second embodiment of the present invention.

Referring next to FIG. 2, in an alternative embodiment of the exposure apparatus, generally indicated by reference numeral 10a, an annular megasonic plate 30a is provided around the optical transfer water immersion chamber 18. The exposure apparatus 10a can be operated according to the flow diagram of FIG. 3A, wherein the annular megasonic plate 30a is operated after the exposure liquid 32 is distributed into the optical transfer water immersion chamber 18 and then turned off prior to the exposure step; according to the flow diagram of FIG. 3B, wherein the annular megasonic plate 30a remains on during distribution of the exposure liquid 32 into the optical transfer water immersion chamber 18 and throughout the exposure process; or according to the flow diagram of FIG. 3C, wherein the annular megasonic plate 30a is turned on intermittently during the exposure step. In any case, the exposure liquid 32 contained in the optical transfer chamber 18 is substantially devoid of microbubbles which could otherwise distort the circuit pattern image transmitted to the wafer 34 during the exposure step.

Figure 4:
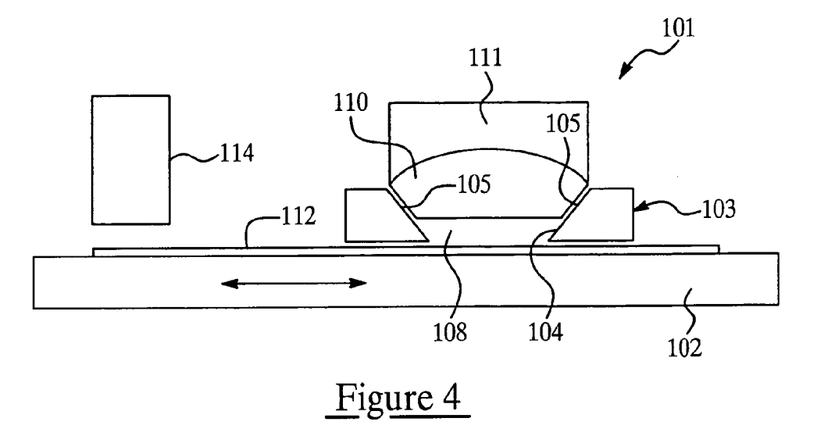
FIG. 4 is a schematic view of an illustrative embodiment of a lens cleaning module according to the present invention.
Figure 6:
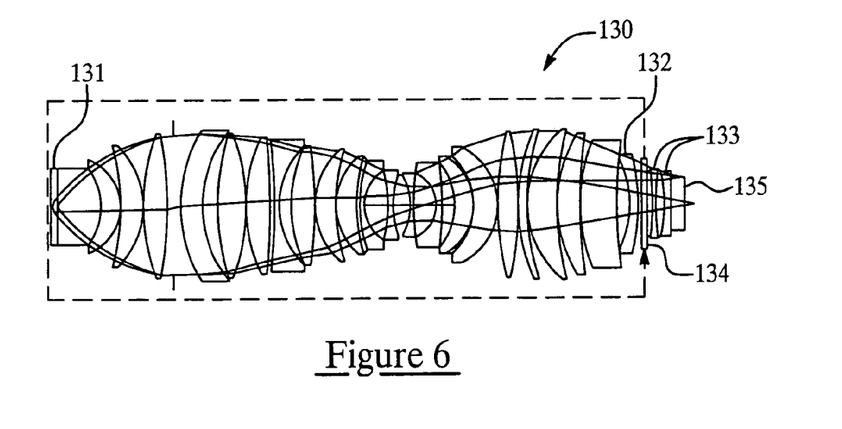
FIG. 6 is a schematic view of an exposure apparatus which is compatible with the lens cleaning modules of the present invention.

Referring next to FIGS. 4 and 6, an illustrative embodiment of a non-manual lens cleaning module according to the present invention is generally indicated by reference numeral 101 in FIG. 4. As shown in FIG. 6, the lens cleaning module 101 is suitable for implementation in conjunction with an exposure apparatus 130, which may be conventional. A UV source 131 which emits ultraviolet light is provided at one end of the exposure apparatus 130. Preferably, the UV source 131 emits UV light having less than 480 nm. An objective lens 133 is provided at the opposite end of the exposure apparatus 130. Preferably, the objective lens 133 has an N.A. of larger than about 0.35. A condenser element 132 is provided between the UV source 131 and the objective lens 133 to condense the ultraviolet light before it passes through the objective lens 133. A mask 134 is provided between the condenser element 132 and the objective lens 133. A wafer 135 is supported on a wafer stage (not shown) beneath or adjacent to the objective lens 133. The lens cleaning module 101 may include a heating/drying module 114 for drying the lens 110 after cleaning.

In operation of the exposure apparatus 130, the UV source 131 emits a beam of ultraviolet light, which passes first through the condenser element 132, then through the mask 134 and objective lens 133, respectively. The mask 134 enables passage of light which corresponds to the circuit pattern to be transferred to the wafer 135. The objective lens 133 focuses the light, in the circuit pattern image defined by the mask 134, on the wafer 135. The lens cleaning module 101 can be incorporated into the exposure apparatus 130 to remove particles, liquid marks and residues from the objective lens 133 in order to enhance the exposure quality of the exposure apparatus 130.

As shown in FIG. 4, the lens cleaning module 101 typically includes a scanning stage 102 which has bi-directional movement capability and is adapted to support a wafer 112 beneath the exposure apparatus (not shown), such as the exposure apparatus 130 which was heretofore described with respect to FIG. 6, for example. A dish 103 is provided above the scanning stage 102. The dish 103 includes a central dish opening 104 having a beveled dish surface 105. A cleaning fluid 108 is contained in the dish opening 104 of the dish 103. The objective lens 110 of the exposure apparatus is seated against the beveled dish surface 105 of the dish 103 and contacts the cleaning fluid 108. The mask 111 of the exposure apparatus is provided above the lens 110. The cleaning fluid 108 may be acetone, IPA (isopropyl alcohol) or other solvent which does not contain water or fluoride and is incapable of damaging, corroding or reacting with the surface coating of the objective lens 110. Accordingly, before, during and after exposure of the wafer 112 through the mask 111 and lens 110, the fluid 108 removes particles, liquid marks and residues from the lens 110, thereby enhancing the exposure quality of the exposure apparatus and the precision of circuit pattern images transferred from the mask 111 to the wafer 112. The heating/drying module 114 may utilize thermal, gas spray or other methods known by those skilled in the art to facilitate the evaporation of the cleaning fluid 108 from the objective lens 110.

Figure 5:
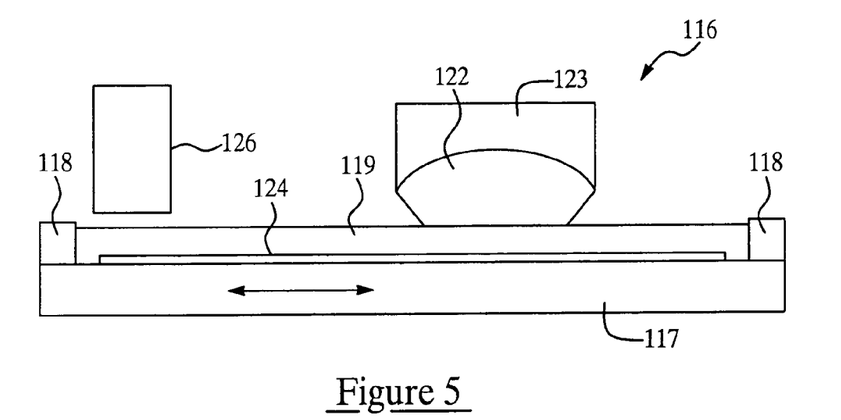
FIG. 5 is a schematic view of another illustrative embodiment of a lens cleaning module according to the present invention.

Referring next to FIG. 5, another illustrative embodiment of the lens cleaning module of the present invention is generally indicated by reference numeral 116. The lens cleaning module 116 typically includes a scanning stage 117, which may have bidirectional movement capability, as shown by the arrow, and is adapted to support a wafer 124. A fluid retaining wall 118 is provided on the scanning stage 117 and is adapted to contain a cleaning fluid 119 on the scanning stage 117. The lens 122 of the exposure apparatus contacts the cleaning fluid 119, and the mask 123 is provided above the lens 122. Accordingly, during exposure of the wafer 124, the cleaning fluid 119 removes particles, liquid marks and residues from the lens 122, thereby enhancing the exposure quality of the exposure apparatus and the precision of circuit pattern images transferred from the mask 123 to the wafer 124. The lens cleaning module 116 may include a heating/drying module 126 which may utilize thermal, gas spray or other methods known by those skilled in the art to facilitate the evaporation of the cleaning fluid 119 from the objective lens 122.

Figure 7:
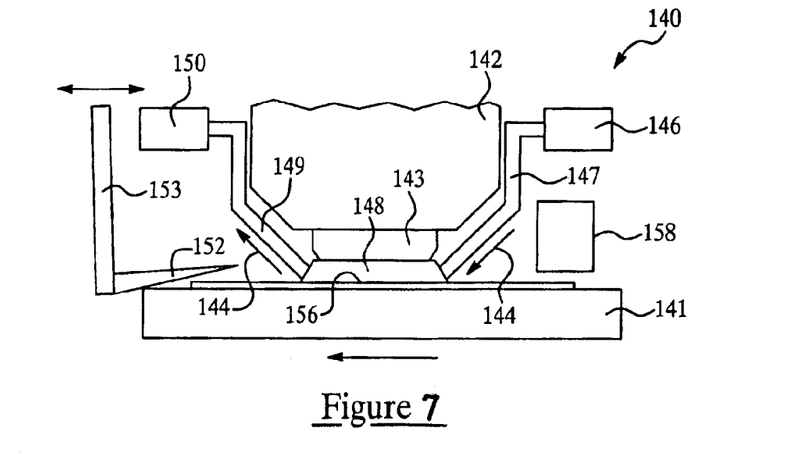
FIG. 7 is a schematic view of still another illustrative embodiment of the lens cleaning module according to the present invention.

Referring next to FIG. 7, still another illustrative embodiment of the lens cleaning module of the present invention is generally indicated by reference numeral 140. The lens cleaning module 140 includes a wafer stage 141 which is adapted to support a wafer 156. The optical housing 142 of the exposure apparatus is disposed above the wafer stage 141, and the lens 143 is provided on the optical housing 142. A liquid supply tank 146 is provided at one side of the optical housing 142 and contains a supply of cleaning liquid 144. A liquid supply conduit 147 extends from the liquid supply tank 146 to a liquid collecting area 148 beneath the lens 143. A liquid recovery tank 150 is provided at the opposite side of the optical housing 142. A liquid recovery conduit 149 extends from the liquid recovery tank 150 to the liquid collecting area 148, typically opposite the liquid supply conduit 147. A liquid sealing member 152 may be supported by a support 153 and engage the upper edge of the wafer stage 141, beneath the liquid recovery tank 150, to prevent the inadvertent flow of cleaning liquid 144 from the wafer stage 141. The lens cleaning module 140 may include a heating/drying module 158 which may utilize thermal, gas spray or other methods known by those skilled in the art to facilitate the evaporation of the cleaning, liquid 144 from the objective lens 143.

In use of the lens cleaning module 140, cleaning liquid 144 is distributed from the liquid supply tank 146, through the liquid supply conduit 147 to the liquid collecting area 148, respectively. Simultaneously, the cleaning liquid 144 is pumped from the liquid collecting area 148, through the liquid recovery area 149 and into the liquid recovery tank 150, respectively. Accordingly, the lens 143 is continually exposed to the cleaning liquid 144 flowing through the liquid collecting area 148, thus removing particles, liquid marks and residues from the lens 143 and enhancing the exposure quality of the exposure apparatus and the precision of circuit pattern images transferred from the mask 123 to the wafer 124.

Figure 8A:
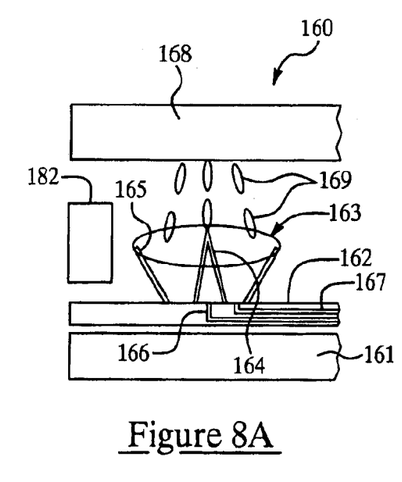
FIG. 8A is a schematic view, partially in section, of another embodiment of the lens cleaning module according to the present invention.

Referring next to FIG. 8A, yet another illustrative embodiment of the lens cleaning module according to the present invention is generally indicated by reference numeral 160. The lens cleaning module 160 includes a scanning stage 161 for supporting a wafer (not shown). A cleaning stage 162, which may be removable, is positional above the scanning stage 161, and at least one cleaning unit 163 is provided on the upper surface of the cleaning stage 162, beneath the objective lens 168 of the exposure apparatus. Each cleaning unit 163 may be fixedly or pivotally mounted on the cleaning stage 162. Each cleaning unit 163 typically includes a central dispensing nozzle 164, and a collecting annulus 165, which encircles the dispensing nozzle 164. An inlet conduit 166 extends through the cleaning stage 162 and is provided in fluid communication with the dispensing nozzle 164. A supply reservoir (not shown) which contains a supply of cleaning liquid 169 is provided in fluid communication with the inlet conduit 166. An outlet conduit 167 extends from the collecting annulus 165. A stand-by area (not shown) for the cleaning stage 162 may be provided next to the lens cleaning module 160. The lens cleaning module 160 may include a heating/drying module 182 which may utilize thermal, gas spray or other methods known by those skilled in the art to facilitate the evaporation of the cleaning liquid 169 from the objective lens 168.

In use of the lens cleaning module 160, the cleaning liquid 169 is distributed through the inlet conduit 166 and ejected from the dispensing nozzle 164 and against the lens 168 to remove particles, liquid marks and residues from the lens 168. The cleaning liquid 169 falls into the collecting annulus 165 and is distributed through the outlet conduit 167 to a suitable receptacle or outlet (not shown).

Figure 8B:
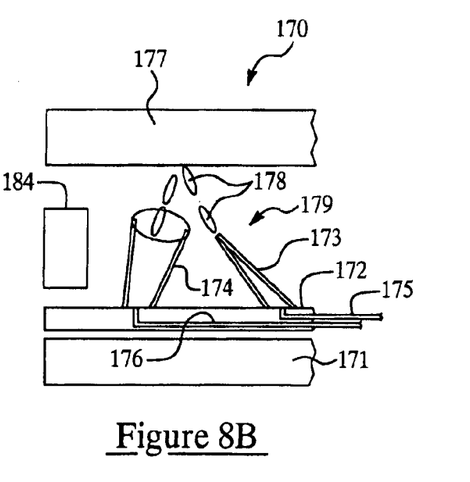
FIG. 8B is a schematic view, partially in section, of yet another embodiment of the lens cleaning module according to the present invention.

Referring next to FIG. 8B, still another embodiment of the lens cleaning module according to the present invention is generally indicated by reference numeral 170. The lens cleaning module 170 includes a scanning stage 171 for supporting a wafer (not shown). A cleaning stage 172 is provided above the scanning stage 171. At least one cleaning unit 179 is provided on the cleaning stage 172. Each cleaning unit 179 may be fixedly or pivotally mounted on the cleaning stage 172. Each cleaning unit 179 includes a dispensing nozzle 173 which is directed toward the objective lens 177 of the exposure apparatus and a collector 174 which is adjacent to the dispensing nozzle 173. An inlet conduit 175 is provided in fluid communication with the dispensing nozzle 173 and is connected to a supply (not shown) of cleaning liquid 178. An outlet conduit 176 extends from the collector 174. The lens cleaning module 170 may include a heating/drying module 184 which may utilize thermal, gas spray or other methods known by those skilled in the art to facilitate the evaporation of the cleaning liquid 178 from the objective lens 177.

In use of the lens cleaning module 170, the cleaning liquid 178 is distributed through the inlet conduit 175 and ejected from the dispensing nozzle 173, against the lens 177 to remove particles, liquid marks and residues from the lens 177. After striking the lens 177, the cleaning liquid 178 falls into the collector 174 and is distributed through the outlet conduit 176 to a suitable receptacle or outlet (not shown).

In the various embodiments, the lens cleaning modules of the present invention can be integrated with the lithography system of which they are a part for automated cleaning of the objective lens in the exposure apparatus. Accordingly, pre-cleaning and post-cleaning of the objective lens before and after exposure, respectively, is possible. The cycle time of each cleaning cycle may be set by recipe for automatic implementation. The frequency of lens cleaning can be as high as once per exposed wafer, thus decreasing periodic maintenance (PM) manpower and cycle time to maintain consistent maintenance quality. Furthermore, the lens cleaning module can be movable with respect to the exposure apparatus to facilitate cleaning and maintenance of the lens cleaning module, for example. Moreover, each lens cleaning module may utilize contact with a physical object such as a sponge, for example, alone or in combination with a cleaning fluid or immersion liquid, as was heretofore described. In that case, the lens cleaning module typically includes a contacting material such as a sponge; a cleaning fluid or solvent which is contacted by the contacting material prior to contact of the material with the lens; and a collecting system for collecting the fluid or solvent. Referring again to FIG. 6, each lens cleaning module may be adapted to additionally or alternatively clean the condenser element 132, windows (not shown) or other element or elements of the exposure apparatus 130 of which they are a part.

While the preferred embodiments of the invention have been described above, it will be recognized and understood that various modifications can be made in the invention and the appended claims are intended to cover all such modifications which may fall within the spirit and scope of the invention.

What is claimed is:

1. A lithography system having an exposure apparatus including an objective lens, the lithography system comprising:
    a lens cleaning module for providing a cleaning fluid;
    an immersion fluid module different from the lens cleaning module for providing an immersion fluid, the immersion fluid being different than the cleaning fluid;
    a scanning stage for supporting a wafer beneath the objective lens, the scanning stage defining an exposure field; and
    a liquid retainer associated with the scanning stage, the liquid retainer including a fluid retaining wall carried by the scanning stage such that one of the cleaning fluid and immersion fluid is provided directly on the scanning stage and is retained by the fluid retaining wall for contacting the objective lens during exposure of the wafer,
    wherein the fluid retaining wall moves relative to the objective lens with movement of the scanning stage,
    wherein the lens cleaning module provides the cleaning fluid directly on the scanning stage such that only the cleaning fluid contacts the objective lens during cleaning of the objective lens.

2. The lithography system of claim 1, wherein said cleaning module further comprises a supply system providing the cleaning fluid.

3. The lithography system of claim 2, wherein said cleaning module further comprises a part collecting or removing the cleaning fluid.

4. The lithography system of claim 3 further comprising a heating/drying module associated with said cleaning module for drying the objective lens.

5. The lithography system of claim 1, wherein said lithography system is an immersion lithography apparatus.

6. The lithography system of claim 1, wherein said exposure apparatus has a light source which emits light having a wavelength of less than about 250 nm.

7. The lithography system of claim 1, wherein said objective lens has an N.A. of greater than about 0.75.

8. The lithography system of claim 1, wherein said cleaning fluid is isopropyl alcohol, acetone or an inert solvent devoid of fluoride.

9. The lithography system of claim 1, wherein said cleaning module utilizes a distribution mechanism for distributing the cleaning fluid on the objective lens.

10. The lithography system of claim 1, further comprising a collecting system for collecting the cleaning fluid.

11. The lithography system of claim 1, wherein said retaining wall is coupled to the scanning stage around the exposure field, the liquid retainer configured to flood the stage with the one of the cleaning fluid and immersion fluid.

12. A method for patterning semiconductor wafers by immersion lithography to improve exposure quality comprising the steps of:

loading a semiconductor wafer on a stage of a non-manual lens cleaning module integrated with an immersion lithography apparatus having an immersion fluid module different from the lens cleaning module, the stage defining an exposure field;

filling an immersion liquid, by the immersion fluid module, in a space between said wafer and an objective lens of said immersion lithography apparatus, the immersion liquid retained by a liquid retainer associated with the stage, the liquid retainer configured to retain the immersion liquid in the space such that the immersion liquid is in direct contact with the objective lens, the liquid retainer allowing passage of an exposure light through the liquid to the exposure field; and cleaning a surface of said objective lens utilizing a cleaning fluid provided by the non-manual lens cleaning module while the objective lens is over the exposure field and the semiconductor wafer;

wherein said liquid retainer includes a fluid retaining wall carried by said stage such that the cleaning fluid provided directly on said stage is retained by said fluid retaining wall such that only the cleaning fluid contacts for contacting said objective lens during said cleaning, wherein the fluid retaining wall moves relative to said objective lens with movement of the scanning stage;

wherein the immersion liquid is different than the cleaning fluid.

13. The method for patterning semiconductor wafers by immersion lithography according to claim 12, wherein said non-manual lens cleaning module further comprises a cleaning fluid distribution system.

14. The method for patterning semiconductor wafers by immersion lithography according to claim 12 wherein said non-manual lens cleaning module further comprises a cleaning fluid removing/collecting system.

15. A method for patterning semiconductor wafers by immersion lithography to improve exposure quality comprising the steps of:

utilizing a non-manual lens cleaning module to clean the surface of an objective lens of an immersion lithography apparatus before exposure processing, wherein the cleaning module comprises:

a scanning stage defining an exposure field;

a cleaning stage removably coupled to the scanning stage, the cleaning stage having a top surface facing the objective lens; and a cleaning unit coupled to the cleaning stage, the cleaning unit comprising at least one dispensing nozzle and at least one cone-shaped collecting annulus extending from the top surface of the cleaning stage toward the objective lens, the cleaning unit configured to clean the objective lens with a first liquid while the objective lens is over the exposure field;

loading a semiconductor wafer on the scanning stage;

ejecting the first liquid from the at least one dispensing nozzle against the objective lens such that the first liquid is deflected into the at least one cone-shaped collecting annulus;

filling a second liquid different from the first liquid between said wafer and the objective lens of said immersion lithography apparatus;

exposing said semiconductor wafer to a light source having a wavelength of less than about 250 nm.

16. The method for patterning semiconductor wafers by immersion lithography according to claim 15, wherein said non-manual lens cleaning module further comprises a first fluid distribution system in fluid communication with the cleaning unit for circulating the first liquid and said immersion lithography apparatus further comprises a second fluid distribution system for circulating the second liquid.

17. The method for patterning semiconductor wafers by immersion lithography according to claim 15, further comprising removing the cleaning stage before loading the semiconductor wafer.

18. The method for patterning semiconductor wafers by immersion lithography according to claim 15, wherein the at least one dispensing nozzle is centrally disposed within the at least one cone-shaped collecting annulus, the collecting annulus encircling the nozzle.

19. The method for patterning semiconductor wafers by immersion lithography according to claim 15, wherein the at least one dispensing nozzle is fixedly mounted to the cleaning stage at an angle, and wherein the collecting annulus is fixedly mounted to the cleaning stage opposite the at least one dispensing nozzle.

20. The method for patterning semiconductor wafers by immersion lithography according to claim 15, wherein the at least one dispensing nozzle is pivotally mounted to the cleaning stage such that the dispensing nozzle pivots relative to the cleaning stage, and wherein the collecting annulus is pivotally mounted to the cleaning stage opposite the at least one dispensing nozzle such that the collecting annulus pivots relative to the cleaning stage.

21. The method of claim 15, wherein the at least one cone-shaped collecting annulus extends a greater distance from the top surface toward the objective lens than the dispensing nozzle.

* * * * *